US008779571B2

(12) United States Patent
Lee (10) Patent No.: US 8,779,571 B2
(45) Date of Patent: Jul. 15, 2014

(54) INTEGRATED CIRCUIT HAVING A THREE DIMENSIONAL STACK PACKAGE STRUCTURE

(75) Inventor: Kang-Seol Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 353 days.

(21) Appl. No.: 13/101,660

(22) Filed: May 5, 2011

(65) Prior Publication Data

US 2012/0153497 A1 Jun. 21, 2012

(30) Foreign Application Priority Data

Dec. 17, 2010 (KR) .................. 10-2010-0129743

(51) Int. Cl.
 H01L 29/788 (2006.01)
 H01L 23/02 (2006.01)
 H01L 23/48 (2006.01)
 H01L 23/52 (2006.01)
 H01L 29/40 (2006.01)

(52) U.S. Cl.
 USPC ........... 257/686; 257/321; 257/777; 257/737; 257/738

(58) Field of Classification Search
 USPC .................. 257/321, 777, 686, 737, 738
 See application file for complete search history.

(56) References Cited

U.S. PATENT DOCUMENTS

| 5,763,939 | A  | * | 6/1998  | Yamashita   | 257/668 |
| 6,756,628 | B2 | * | 6/2004  | Echigo et al. | 257/306 |
| 6,875,921 | B1 | * | 4/2005  | Conn        | 174/534 |
| 6,916,706 | B2 | * | 7/2005  | Echigo et al. | 438/253 |
| 7,233,061 | B1 | * | 6/2007  | Conn        | 257/686 |
| 8,309,409 | B2 | * | 11/2012 | Momota      | 438/173 |
| 8,384,235 | B2 | * | 2/2013  | Baba et al. | 307/1   |
| 2010/0052111 | A1 | * | 3/2010 | Urakawa    | 257/621 |
| 2011/0121433 | A1 | * | 5/2011 | Kim        | 257/621 |
| 2011/0317387 | A1 | * | 12/2011 | Pan et al. | 361/782 |

FOREIGN PATENT DOCUMENTS

| KR | 1020060081900 | 7/2006 |
| KR | 1020090008128 | 1/2009 |

\* cited by examiner

*Primary Examiner* — David Zarneke
(74) *Attorney, Agent, or Firm* — IP & T Group LLP (57) ABSTRACT

An integrated circuit includes a first semiconductor chip including a plurality of first through chip vias for a first voltage and a plurality of second through chip vias for a second voltage inserted in vertical direction. A second semiconductor chip is stacked over the first semiconductor chip, and includes the plurality of first through chip vias and the plurality of second through chip vias. The plurality of first connection pads is configured to couple the first semiconductor chip to the second semiconductor chip, by coupling the corresponding first through chip vias. The plurality of second connection pads is configured to couple the first semiconductor chip to the second semiconductor chip, by coupling the corresponding second through chip vias. A first conductive line is configured to couple the plurality of first connection pads to each other, and a second conductive line is configured to couple the plurality of second connection pads to each other. An isolation layer is inserted between the first conductive line and the second conductive line.

11 Claims, 6 Drawing Sheets

INTEGRATED CIRCUIT HAVING A THREE DIMENSIONAL STACK PACKAGE STRUCTURE

CROSS-REFERENCE TO RELATED APPLICATIONS

The present application claims priority of Korean Patent Application No. 10-2010-0129743, filed on Dec. 17, 2010, which is incorporated herein by reference in its entirety.

BACKGROUND

1. Field of the Invention

Exemplary embodiments of the present invention relate to a semiconductor design technique, and more particularly, to a semiconductor integrated circuit having a three dimensional (3D) stack package structure.

2. Description of the Related Art

Technology for packaging a semiconductor integrated circuit has been developed to satisfy the need for reliable, small-sized packaging. Particularly, various technologies regarding stack packaging have developed recently in response to the demand for the miniaturization and high performance of electrical/electronic devices.

A 'stack package' in the semiconductor technology field refers to a device that has two or more chips or packages stacked in a vertical direction. By implementing a stack package, a semiconductor memory device may have a memory capacity that has more than twice the memory capacity achieved through a typical semiconductor integration process. Because of the advantages of the stack package with respect to memory capacity, package density, and package size, research and development of the stack package has accelerated.

A stack package may be formed by stacking semiconductor chips, and then packaging the stacked semiconductor chips. Alternatively, the stack package may be formed by first packaging semiconductor chips, and then stacking the packaged semiconductor chips. The respective semiconductor chips in the stack package are electrically connected to each other through a metal wire or a through chip via. The stack package using a through chip via has a structure such that semiconductor chips are physically and electrically connected to each other in a vertical direction by a through chip via formed within a semiconductor substrate.

Figure 1:
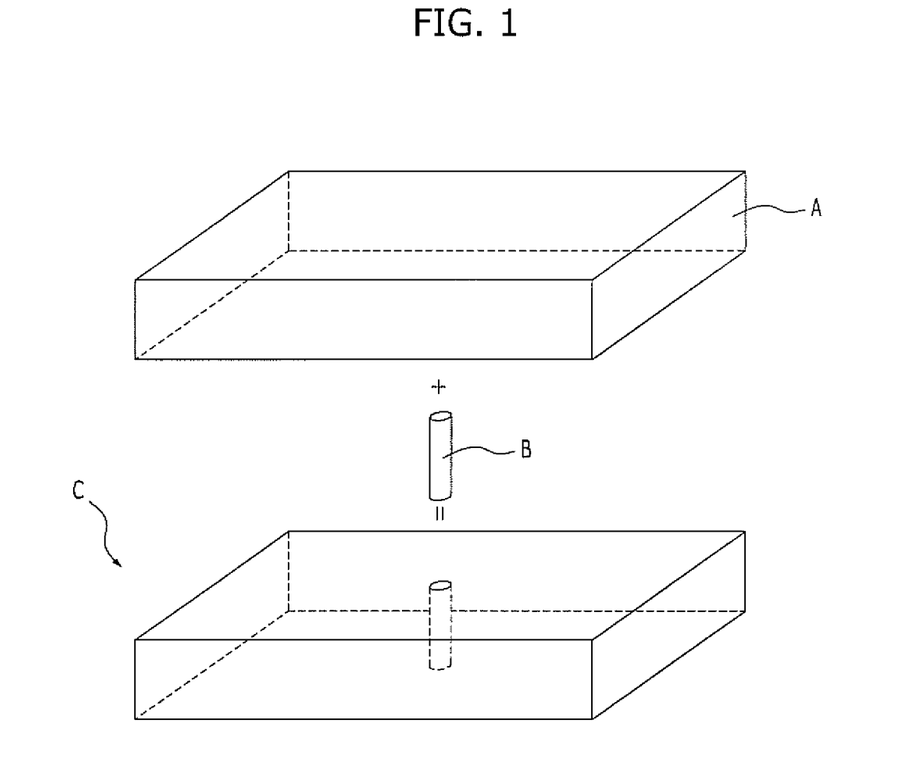
FIG. 1 is a perspective view showing a semiconductor chip including a through chip via.

FIG. 1 is a perspective view illustrating a semiconductor chip including a through chip via.

Referring to FIG. 1, a stack package C is formed by forming a hole within a semiconductor chip A, filling the hole with a metal, e.g., Cu, having good conductivity to form a through chip via B, and then stacking another semiconductor chip A on top of the semiconductor chip A having the through chip via B. A plurality of stacked semiconductor chips A is packaged in a package substrate such as a printed circuit board (PCB) to form a semiconductor integrated circuit. Generally, the semiconductor integrated circuit is called a three dimensional (3D) stack package semiconductor integrated circuit.

Figure 2:
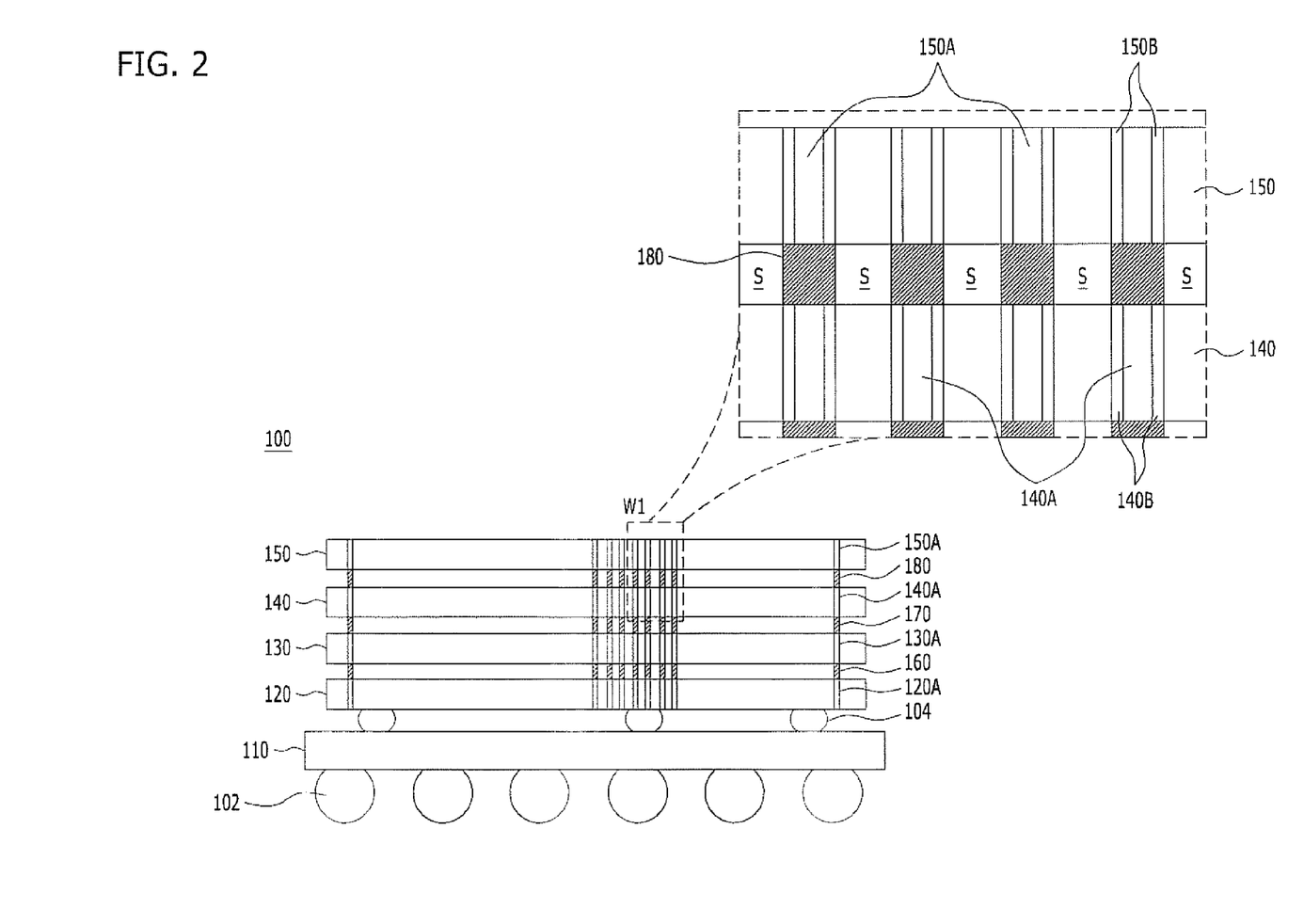
FIG. 2 is a cross-sectional view of the 3D stack package semiconductor integrated circuit.

FIG. 2 is a cross-sectional view showing the 3D stack package semiconductor integrated circuit. For the sake of convenience, the 3D stack package semiconductor integrated circuit including only four semiconductor chips stacked on a surface of a package substrate is illustrated and described.

Referring to FIG. 2, a 3D stack package semiconductor integrated circuit (hereinafter referred to "a semiconductor integrated circuit") 100 includes a package substrate 110, first to fourth semiconductor chips 120, 130, 140 and 150, first to fourth through chip vias 120A, 130A, 140A and 150A, and first to third connection pads 160, 170, and 180. The first to fourth semiconductor chips 120, 130, 140 and 150 are stacked on a top surface of the package substrate 110 in a vertical direction. The first to fourth through chip vias 120A, 130A, 140A and 150A are provided to the first to fourth semiconductor chips 120, 130, 140 and 150, respectively. The first connection pad 160 is formed between the first semiconductor chip 120 and the second semiconductor chip 130 to connect the first through chip via 120A to the second through chip via 130A. The second connection pad 170 is formed between the second semiconductor chip 130 and the third semiconductor chip 140 to connect the second through chip via 130A to the third through chip via 140A. The third connection pad 180 is formed between the third semiconductor chip 140 and the fourth semiconductor chip 150 to connect the third through chip via 140A to the fourth through chip via 150A.

The package substrate 110 electrically connects an external controller (not shown) to the first semiconductor chip 120. The package substrate 110 includes an external connection terminal 102 on a bottom surface of the package substrate 110 for providing an electrical connection for connecting to the external controller. Also, the package substrate 110 includes an internal connection terminal 104 on a top surface of the package substrate 110 for providing an electrical connection to the first to fourth semiconductor chips 120, 130, 140 and 150. As such, the package substrate 110 interfaces signals and power with the external controller through the external connection terminal 102 to transfer the received signals and power to the first semiconductor chip 120, and transfer signals received from the first to fourth semiconductor chips 120, 130, 140 and 150 to the external controller through the external connection terminal 102. For example, a printed circuit board (PCB) may be used as the package substrate 110.

The first to fourth semiconductor chips 120, 130, 140 and 150 perform a certain operation in response to signals and power provided from the package substrate 110. For example, the first to fourth semiconductor chips 120, 130, 140 and 150 store data provided from the external controller, or provide stored data to the external controller. A P-type substrate doped by a P-type impurity may be used as the first to fourth semiconductor chips 120, 130, 140 and 150. At this time, several circuits for certain operations are disposed on an active layer formed on a top surface of the P-type substrate.

The first to fourth through chip vias 120A, 130A, 140A and 150A interface various signals and power, and are implemented by using a metal with good conductivity, e.g., Cu, Al, etc. The first to fourth through chip vias 120A, 130A, 140A and 150A may be through silicon vias (TSV). Hereinafter, for the sake of convenience, the first to fourth through chip vias 120A, 130A, 140A and 150A for interfacing power (e.g., a power supply voltage signals, a ground voltage supply signal, etc.) will be described.

The first to third connection pads 160, 170 and 180 may include a bump pad, respectively.

Hereinafter, the semiconductor integrated circuit 100 will be described in detail. The semiconductor integrate circuit 100 has a similar connection configuration and a similar structure of a semiconductor chip—a connection pad—a semiconductor chip in sequence. Thus, for the sake of convenience, only portion W1 of the semiconductor integrated circuit 100 will be described.

In the enlarged portion W1, the third semiconductor chip 140 includes a plurality of third through chip vias 140A, and the fourth semiconductor chip 150 includes a plurality of fourth through chip vias 150A. A plurality of third connection pads 180 is disposed between the third semiconductor chip 140 and the fourth semiconductor chip 150 to connect the third through chip vias 140A to the respective fourth through chip vias 150A. A plurality of third isolation layers 140B encompasses the respective surroundings of the plurality of third through chip vias 140A, respectively. A plurality of fourth isolation layers 150B encompasses the respective surroundings of the plurality of fourth through chip vias 150A, respectively. The plurality of third isolation layers 140B prevents an electrical connection between the plurality of third through chip vias 140A and the third semiconductor chip 140. The plurality of fourth isolation layers 150B prevents an electrical connection between the plurality of fourth through chip vias 150A and the fourth semiconductor chip 150. Openings S are formed between the third semiconductor chip 140 and the fourth semiconductor chip 150, due to the plurality of third connection pads 180. Openings S are conventionally filled with polymer.

As described above, the semiconductor integrated circuit 100 is provided with power through the first to fourth through chip vias 120A, 130A, 140A and 150A. Thus, power consumption and signal delay can be reduced and operation performance can be increased due to the improved bandwidth.

However, the semiconductor integrated circuit 100 may have disadvantages as discussed below.

The first to fourth through chip vias 120A, 130A, 140A and 150A should be provided to the first to fourth semiconductor chips 120, 130, 140 and 150, respectively. As a result, the first to fourth semiconductor chips 120, 130, 140 and 150 may increase in size and such an increment in size may not be desirable in view of the trend towards high integration in a semiconductor integrated circuit. Coping with this situation, unnecessary circuits among various circuits disposed on active layers of the first to fourth semiconductor chips 120, 130, 140 and 150 may be removed. For example, a reservoir capacitor included in a peripheral region of the semiconductor chip can be removed to reduce the size of the semiconductor chip. However, this scheme makes a power provided through the first to fourth through chip vias 120A, 130A, 140A and 150A unstable. Furthermore, it may cause malfunction of the first to fourth semiconductor chips 120, 130, 140 and 150 and affect operational reliability of the semiconductor integrated circuit 100.

SUMMARY

Exemplary embodiments of the present invention are directed to an integrated circuit which is capable of reducing the size of the integrated circuit and providing power stably.

In accordance with an exemplary embodiment of the invention, an integrated circuit includes a first semiconductor chip including a plurality of first through chip vias for a first voltage and a plurality of second through chip vias for a second voltage inserted in vertical direction, a second semiconductor chip stacked over the first semiconductor chip, including the plurality of first through chip vias and the plurality of second through chip vias, a plurality of first connection pads configured to couple the first semiconductor chip to the second semiconductor chip, by coupling the corresponding first through chip vias, a plurality of second connection pads configured to couple the first semiconductor chip and the second semiconductor chip, by coupling the corresponding second through chip vias, a first conductive line configured to couple the plurality of first connection pads to each other, a second conductive line configured to coupling the plurality of second connection pads to each other, and an isolation layer inserted between the first conductive line and the second conductive line.

In accordance with another exemplary embodiment of the invention, an integrated circuit includes a semiconductor chip doped with a first conductive type impurity, and configured to receive a first voltage, a second through chip via inserted in the semiconductor chip in a vertical direction, and configured to receive a second voltage, and a doping region disposed in a bottom of the semiconductor chip, coupled to the second through chip via, and doped with a second conductive type impurity different from the first conductive type impurity.

In accordance with yet another exemplary embodiment of the invention, an integrated circuit includes a first semiconductor chip doped with a first conductive type impurity, and configured to receive a first voltage, a second semiconductor chip stacked over the first semiconductor chip, doped with the first conductive type impurity, and configured to receive the first voltage, a plurality of first and second through chip vias inserted in the first and second semiconductor chips in a vertical direction, and configured to receive a second voltage, a first doping region disposed in a bottom of the first semiconductor chip, coupled to the plurality of second through chip vias, and doped with a second conductive type impurity different from the first conductive type impurity, a second doping region disposed in a bottom of the second semiconductor chip, coupled to the plurality of second through chip vias inserted in the second semiconductor chip in the vertical direction, and doped with the second conductive type impurity, a plurality of first connection pads configured to couple the first semiconductor chip to the second semiconductor chip by coupling the corresponding first through chip vias, a plurality of second connection pads configured to couple the first semiconductor chip to the second semiconductor chip by coupling the corresponding second through chip vias, a first conductive line configured to couple the plurality of first connection pads to each other, a second conductive line configured to couple the plurality of second connection pads to each other, and an isolation layer inserted between the first conductive line and the second conductive line.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments.

In the following descriptions, exemplary embodiments will be described for a case in which an integrated circuit includes four semiconductor chips stacked on a package substrate. Also, for convenience, exemplary embodiments will de described for a case in which through chip vias interface/transfer only power, although it should be understood that the through chip vias may interface/transfer other signals as well.

Figure 3:
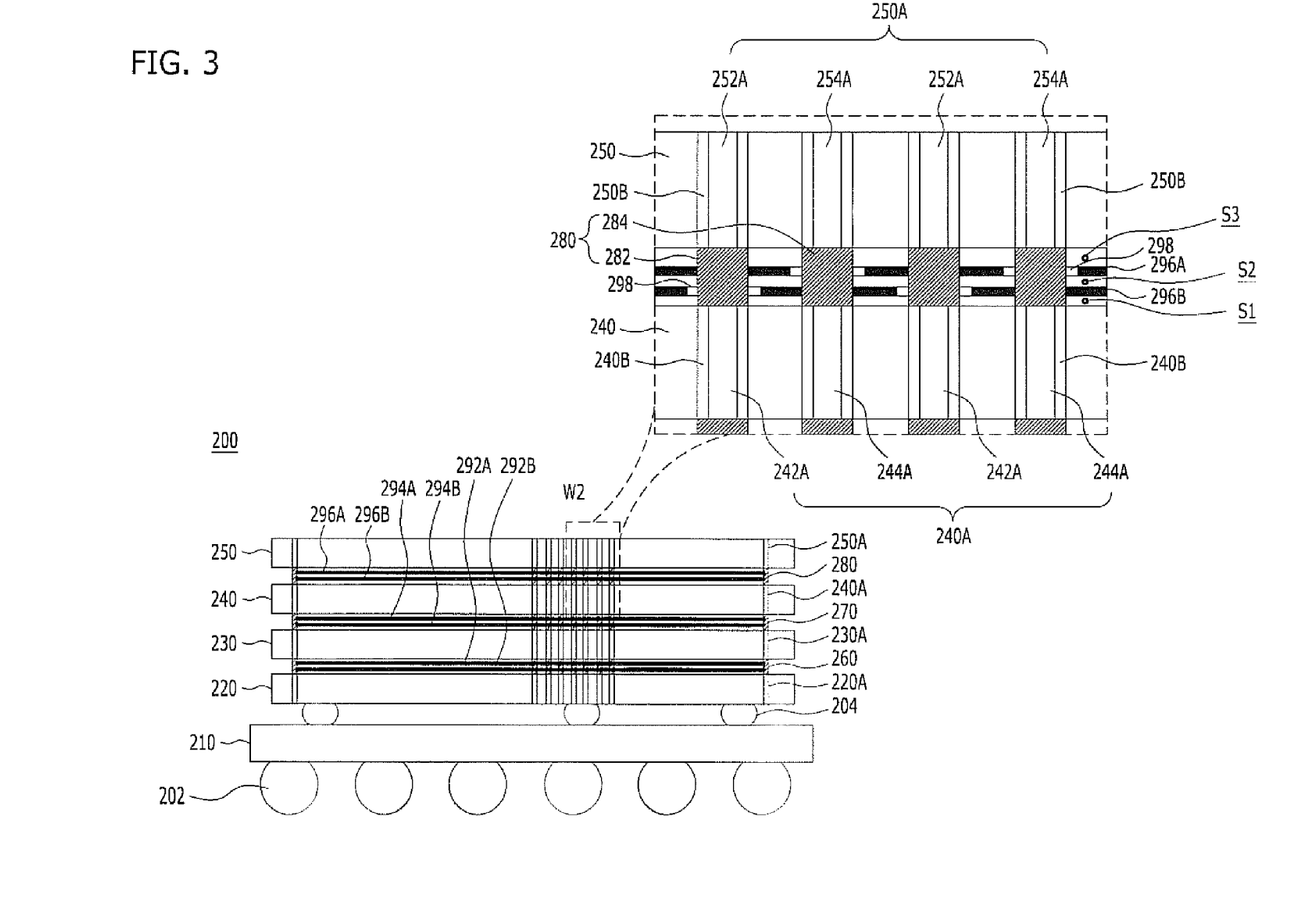
FIG. 3 illustrates a cross-sectional view of an integrated circuit in accordance with a first exemplary embodiment of the invention.

FIG. 3 illustrates a cross-sectional view of an integrated circuit in accordance with a first exemplary embodiment.

Referring to FIG. 3, an integrated circuit 200 includes a package substrate 210 coupled to an external controller (not shown). First to fourth semiconductor chips 220, 230, 240 and 250 are stacked over a top surface of the package substrate 210. A plurality of first to fourth through chip vias 220A, 230A, 240A and 250A are provided with the first to fourth semiconductor chips 220, 230, 240 and 250, respectively. A plurality of first to third connection pads 260, 270 and 280 are respectively disposed between the semiconductor chips, and connects the first to fourth through chip vias 220A, 230A, 240A and 250A. First to third low voltage lines 292A, 294A and 296A are disposed to be connected to the first to third connection pads 260, 270 and 280 and are coupled to respective low voltage connection pads. First to third high voltage lines 292B, 294B and 296B are disposed to be connected to the first to third connection pads 260, 270 and 280 and are coupled to high voltage connection pads.

The package substrate 210 couples an external controller (not shown) to the first semiconductor chip 220. The package substrate 210 includes an external connection terminal 202 on a bottom surface of the package substrate 210 for providing an electrical connection to the external controller. Also, the package substrate 210 includes an internal connection terminal 204 on a top surface of the package substrate 210 connected to the first through chip vias 220A for providing an electrical connection to the first to fourth semiconductor chips 220, 230, 240 and 250. As such, the package substrate 210 is provided with power from the external controller through the external connection terminal 202 to transfer the provided power to the first to fourth semiconductor chips 220, 230, 240 and 250. For example, a printed circuit board (PCB) may be used as the package substrate 210.

The first to fourth semiconductor chips 220, 230, 240 and 250 perform a certain operation in response to an external power provided through the package substrate 210. For example, the first to fourth semiconductor chips 220, 230, 240 and 250 store data provided from the external controller, or provide the stored data to the external controller. A P-type substrate doped by a P-type impurity may be used as the first to fourth semiconductor chips 220, 230, 240 and 250. At this time, several circuits for performing certain operations are disposed on an active layer formed on a top surface of the P-type substrate.

The first to fourth through chip vias 220A, 230A, 240A and 250A receive the power, and are implemented by using a metal having a high conductivity, e.g., Cu, Al, etc. The first to fourth through chip vias 220A, 230A, 240A and 250A may be through silicon vias (TSV).

The first to third connection pads 260, 270 and 280 may include a bump pad, respectively. The first to third low voltage lines 292A, 294A and 296A and the first to third high voltage lines 292B, 294B and 296B may include a metal line, respectively.

Hereinafter, the semiconductor integrated circuit 200 will be described in detail. The semiconductor integrated circuit 200 has a similar connection configuration and a similar structure of a semiconductor chip—a connection pad—a semiconductor chip in sequence. Thus, for the sake of convenience, only portion W2 of the semiconductor integrated circuit 200 will be described.

In the enlarged portion W2, each of a plurality of third through chip vias 240A is provided to the third semiconductor chip 240 in a vertical direction. The plurality of third through chip vias 240A includes a plurality of third through chip vias for a low voltage 242A and a plurality of third through chip vias for a high voltage 244A. A plurality of third isolation layers 240B encompasses the respective surroundings of the plurality of third through chip vias 240A, respectively. The plurality of third isolation layers 240B prevents the plurality of third through chip vias 240A from electrically coupling with the third semiconductor chip 240.

Each of a plurality of fourth through chip vias 250A is provided to the fourth semiconductor chips 250 in the vertical direction. The plurality of fourth through chip vias 250A includes a plurality of fourth through chip vias for a low voltage 252A and a plurality of fourth through chip vias for a high voltage 254A. The fourth through chip vias 252A and the fourth through chip vias 254A are alternately arranged in a horizontal direction. A plurality of fourth isolation layers 250B encompasses the respective surroundings of the plurality of fourth through chip vias 250A, respectively. The plurality of fourth isolation layers 250B prevents the plurality of fourth through chip vias 250A from electrically coupling with the fourth semiconductor chip 250.

The plurality of third connection pads 280 includes a plurality of third connection pads for a low voltage 282 and a plurality of third connection pads for a high voltage 284. The plurality of third low voltage connection pads 282 connects the plurality of third low voltage through chip vias 242A to the plurality of fourth low voltage through chip vias 252A. The plurality of third high voltage connection pads 284 connects the plurality of third high voltage through chip vias 244A to the plurality of fourth high voltage through chip vias 254A.

The third low voltage lines 296A connect the plurality of third low voltage connection pads 282 to each other. The third high voltage lines 296B connect the plurality of third high voltage connection pads 284 to each other. The third low voltage lines 296A and the third high voltage lines 296B are disposed in parallel. Due to this connection, a parasitic capacitor may be formed between the third low voltage lines 296A and the third high voltage lines 296B. Reference numeral 298 denotes an isolation layer, which connects the third low voltage lines 296A and the third high voltage lines 296B to corresponding connection pads of the plurality of third connection pads 280, respectively. Openings S1, S2 and S3 are formed between the third semiconductor chip 240 and the fourth semiconductor chip 250. Openings S1 are formed between the third semiconductor chip 240 and the third high voltage lines 296B. Openings S2 are formed between the third high voltage lines 296B and the third low voltage line 296A. Openings S3 are formed between the third low voltage line 296A and the fourth semiconductor chip 250. In the openings S1 and S3, polymer layers are formed. In the openings S2, isolation layers are formed. That is, polymer layers are formed between the third semiconductor chip 240 and the third high voltage lines 296B, and are formed between the third low voltage line 296A and the fourth semiconductor chip 250. Isolation layers are formed between the third high voltage lines 296B and the third low voltage line 296A. The isolation layers may include oxide with a high dielectric constant to enhance characteristics of the parasitic capacitor.

As described above, the semiconductor integrated circuit in accordance with the first exemplary embodiment includes the first to third low voltage lines 292A, 294A and 296A, the first to third high voltage lines 292B, 2946 and 296B, and isolation layers between the first to third low voltage lines 292A, 294A and 296A and the first to third high voltage lines 292B, 294B and 296B. The first to third low voltage lines 292A, 294A and 296A and the first to third high voltage lines 292B, 294B and 2966 are disposed in parallel between two semiconductor chips 220 and 230, 230 and 240, and 240 and 250, respectively. The first to third low voltage lines 292A, 294A and 296A are biased by a low voltage, e.g., a ground voltage VSS. The first to third high voltage lines 292B, 294B and 2968 are biased by a high voltage, e.g., a power supply voltage VDD. Thus, parasitic capacitors are formed between the first to third low voltage lines 292A, 294A and 296A and the first to third high voltage lines 292B, 294B and 296B. Due to the parasitic capacitors, power provided through the first to fourth through chip vias 220A, 230A, 240A and 250A can be stable. In other words, since the parasitic capacitors serve as reservoir capacitors disposed on an active layer of the first to fourth semiconductor chips 220, 230, 240 and 250, the number of reservoir capacitors disposed on the active layer of the semiconductor chips may be reduced. Accordingly, the semiconductor integrated circuit of the first embodiment can not only make power stable by virtue of the parasitic capacitors, but also reduce the size of the semiconductor chips by virtue of the reduced reservoir capacitors. Furthermore, the semiconductor integrated circuit of the first exemplary embodiment can reinforce a power mesh and thus are robust against noise, since the first to third low voltage lines 292A, 294A, and 296A and the first to third high voltage lines 292B, 294B, and 296B are connected to the corresponding first to third connection pads 260, 270 and 280.

Figure 4:
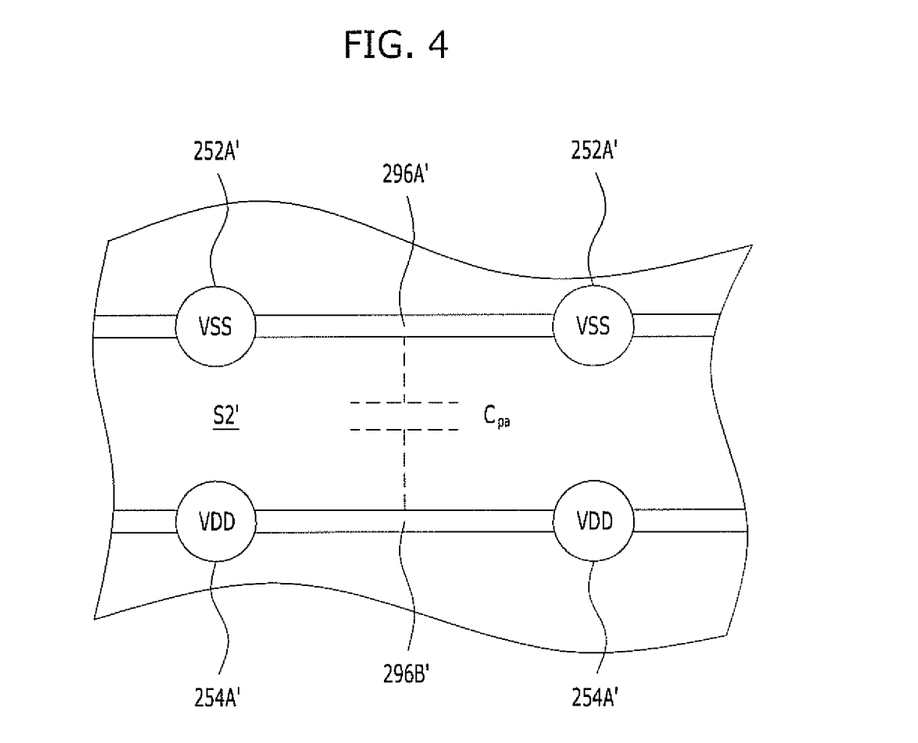
FIG. 4 is a diagram illustrating one example of a structure of third high voltage and low voltage lines shown in FIG. 3.

While the first embodiment has been described in case that low voltage lines and high voltage lines are disposed in a different layer than each other, i.e., in a vertical direction of each other, it can be implemented to dispose the low voltage lines and high voltage lines in the same layer as shown in FIG. 4.

FIG. 4 is a plan view illustrating another example of a disposition structure of third high voltage and low voltage lines shown in FIG. 3. As shown in FIG. 4, a plurality of low voltage connection pads 252A' and a plurality of high voltage connection pads 252B' are disposed along one direction. In this case, the plurality of low voltage connection pads 252A' and the plurality of high voltage connection pads 252W may be disposed in the same layer. That is, the same connection pads 252A' or 254A' may be continuously arranged in a horizontal direction. At this time, isolation layers 298 shown in FIG. 3 are not necessary, since low voltage line 296A' and high voltage line 296B' can be connected to a respective connection pad in the same layer. Similarly, parasitic capacitor Cpa may be formed between the low voltage line 296A' biased by the low voltage, e.g., ground voltage VSS, and the high voltage line 296B' biased by the high voltage, e.g., power supply voltage VDD. By virtue of the parasitic capacitor, the power supply may be stably maintained. Furthermore, by virtue of the disposition of the low voltage line 296A' and the high voltage line 296B', a power mesh may be reinforced.

Figure 5:
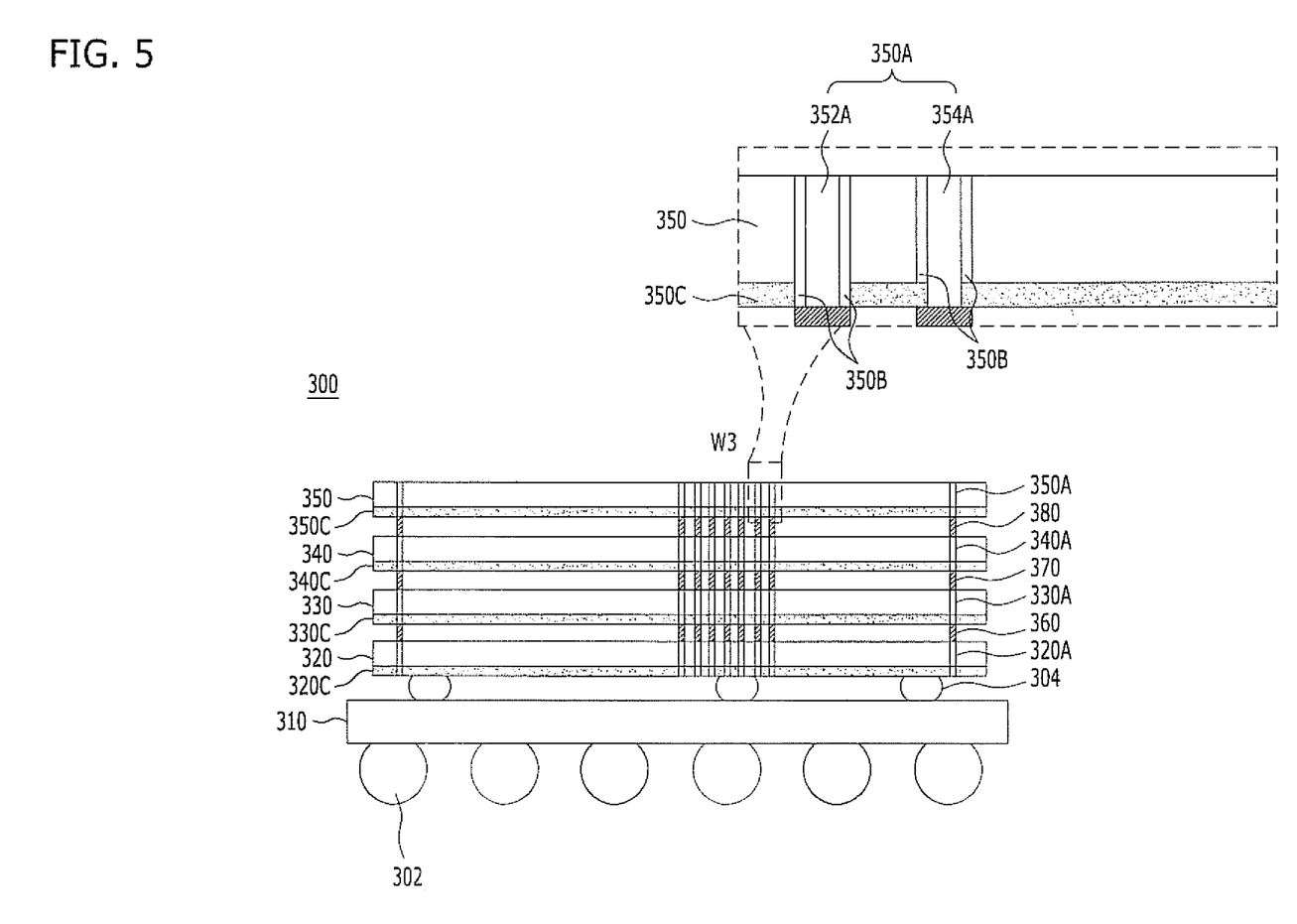
FIG. 5 illustrates a cross-sectional view of an integrated circuit in accordance with a second exemplary embodiment of the invention.

FIG. 5 illustrates a cross-sectional view of an integrated circuit in accordance with a second exemplary embodiment.

Referring to FIG. 5, an integrated circuit 300 includes a package substrate 310 coupled to an external controller (not shown). First to fourth semiconductor chips 320, 330, 340 and 350 are stacked over a top surface of the package substrate 310. A plurality of first to fourth through chip vias 320A, 330A, 340A and 350A are provided to the first to fourth semiconductor chips 320, 330, 340 and 350, respectively. A plurality of first to third connection pads 360, 370 and 380 are respectively disposed between the semiconductor chips, and connects the plurality of first to fourth through chip vias 320A, 330A, 340A and 350A.

The package substrate 310 couples between an external controller (not shown) and the first semiconductor chip 320. The package substrate 310 includes an external connection terminal 302 on a bottom surface of the package substrate 310 for providing an electrical connection to the external controller. Also, the package substrate 310 includes an internal connection terminal 304 on a top surface of the package substrate 310 connected to the first through chip vias 320A for providing an electrical connection to the first to fourth semiconductor chips 320, 330, 340 and 350. As such, the package substrate 310 receives a power from the external controller through the external connection terminal 302 to transfer the provided power to the first to fourth semiconductor chips 320, 330, 340 and 350. For example, a printed circuit board (PCB) may be used as the package substrate 310.

The first to fourth semiconductor chips 320, 330, 340 and 350 perform a certain operation in response to an external power provided through the package substrate 310. For example, the first to fourth semiconductor chips 320, 330, 340, and 350 store data provided from the external controller, or provide the stored data to the external controller. A P-type substrate doped by a P-type impurity may be used as the first to fourth semiconductor chips 320, 330, 340 and 350. At this time, several circuits for certain operations are disposed on an active layer formed on a top surface of the P-type substrate. First to fourth doping regions 320C, 330C, 340C and 350C doped by an N-type impurity are formed on a bottom surface of the first to fourth semiconductor chips 320, 330, 340 and 350.

The first to fourth through chip vias 320A, 330A, 340A and 350A interface/transfer power, and are embodied by a metal having high conductivity, e.g., Cu, Al, etc. The first to fourth through chip vias 320A, 330A, 340A, and 350A may be through silicon vias (TSV).

The first to third connection pads 260, 270, and 280 may include a bump pad, respectively.

Hereinafter, the semiconductor integrated circuit 300 will be described in detail. The first to fourth semiconductor chips 320, 330, 340 and 350 of the semiconductor integrate circuit 300 have the same structure. For the sake of convenience, only portion W3 of the fourth semiconductor chip 350 will be described.

In the enlarged portion W3, fourth doping region 350C doped by an N-type impurity is formed on a bottom surface of the fourth semiconductor chip 350 doped by the P-type impurity. For fast power transmission, the fourth doping region 350C is doped by the N-type impurity with a high concentration.

The fourth through chip via 350A is provided to the fourth semiconductor chip 350 and the fourth doping region 350C in a vertical direction. The fourth through chip via 350A includes a fourth low voltage through chip via 352A and a fourth high voltage through chip via 354A.

A plurality of fourth isolation films 350B encompasses the respective surroundings of the plurality of fourth through chip vias 350A, respectively. Certain isolation films among the plurality of fourth isolation films 350B encompassing the fourth low voltage through chip via 352A make the fourth low voltage through chip via 352A be isolated from both the fourth semiconductor chip 350 and the fourth doping region 350C. In contrast, the other isolation films among the plurality of fourth isolation films 350B encompassing the fourth high voltage through chip via 354A make the fourth high voltage through chip via 354A be isolated only from the fourth semiconductor chip 350. In other words, the other isolation films among the plurality of fourth isolation films 350B encompassing the fourth high voltage through chip via 354A are not formed between the fourth high voltage through chip via 354A and the fourth doping region 350C. Since the fourth high voltage through chip via 354A is connected to the fourth doping region 350C, the fourth doping region 350C is biased by a high voltage, e.g., a power supply voltage VDD. Generally, the fourth semiconductor chip 350 doped by the P-type impurity is biased by a low voltage, e.g., a ground voltage VSS. Thus, a parasitic capacitor may be formed by a P-N junction between the fourth semiconductor chip 350 and the fourth doping region 350C, and may have a significant depletion capacitance between the high voltage VDD and the low voltage VSS.

As described above, the semiconductor integrated circuit in accordance with the second exemplary embodiment includes the first to fourth semiconductor chips 320, 330, 340 and 350, and first to fourth doping regions 320C, 330C, 340C and 350C respectively formed on a bottom surface of the first to fourth semiconductor chips 320, 330, 340 and 350. The first to fourth semiconductor chips 320, 330, 340 and 350 are doped by P-type impurity and are biased by the low voltage VSS. The first to fourth doping regions 320C, 330C, 340C and 350C are biased by the high voltage VDD. Thus, parasitic capacitors are formed between first to fourth semiconductor chips 320, 330, 340 and 350, and the first to fourth doping regions 320C, 330C, 340C and 350C. Due to the parasitic capacitors, a power provided through the first to fourth through chip vias 320A, 330A, 340A and 350A can be stable. In other words, since the parasitic capacitors serve as reservoir capacitors disposed on an active layer of the first to fourth semiconductor chips 320, 330, 340 and 350, the number of reservoir capacitors disposed on the active layer of the semiconductor chips may be reduced. Accordingly, the semiconductor integrated circuit of the second exemplary embodiment can not only make power stable by virtue of the parasitic capacitors, but can also reduce the size of the semiconductor chips by virtue of the reduced reservoir capacitors. Furthermore, the semiconductor integrated circuit of the second exemplary embodiment can reinforce a power mesh and thus is robust against noise, since the first to fourth doping regions 320C, 330C, 340C, and 350C are connected to the plurality of high voltage through chip vias, e.g., 354A.

Figure 6:
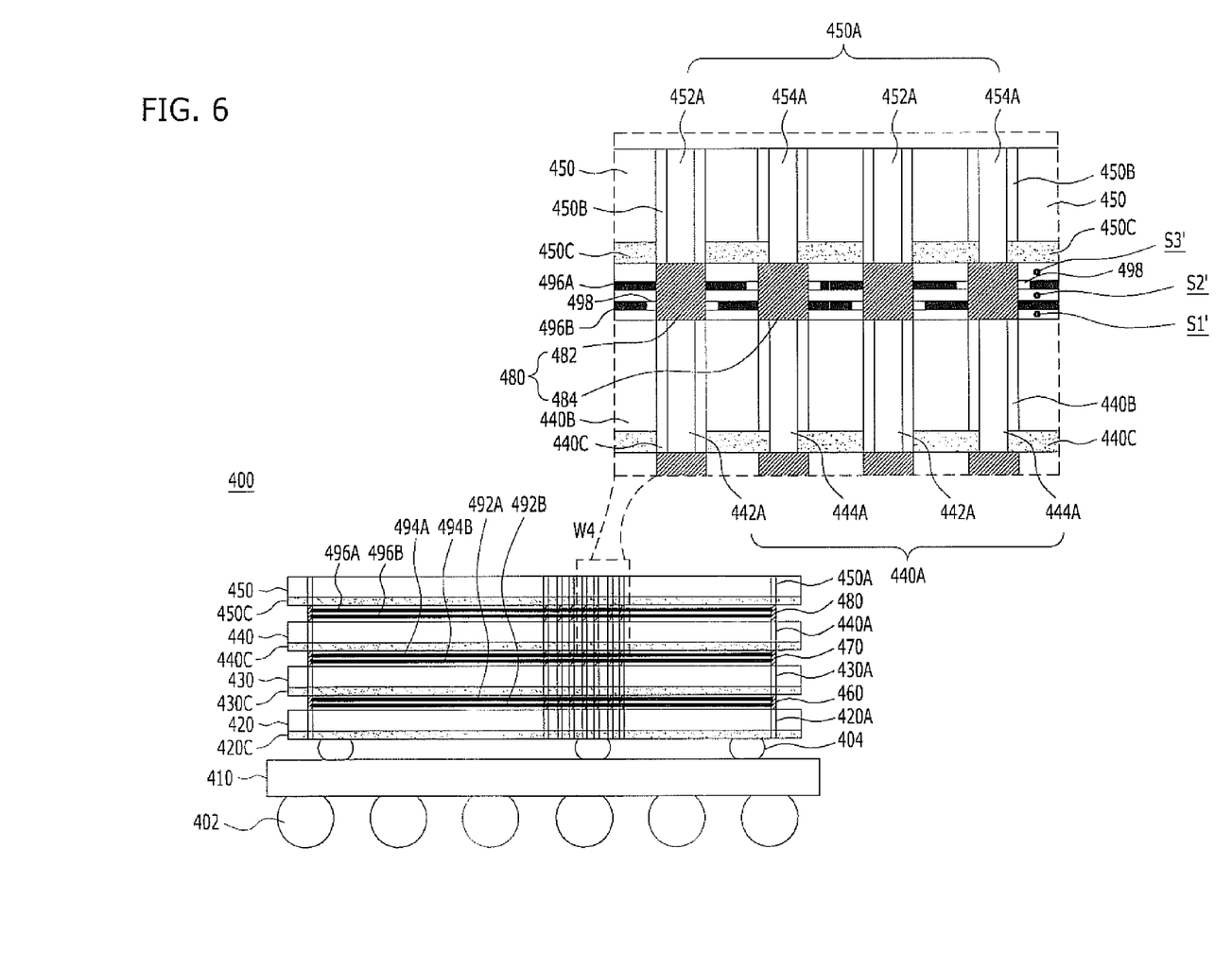
FIG. 6 illustrates a cross-sectional view of an integrated circuit in accordance with a third exemplary embodiment of the invention.

FIG. 6 illustrates a cross-sectional view of an integrated circuit in accordance with a third exemplary embodiment. The third embodiment incorporates the first exemplary embodiment and the second exemplary embodiment.

Referring to FIG. 6, first to fourth connection pads 460, 470 and 480 are disposed, and openings S1, S2 and S3 are formed between first to fourth semiconductor chips 420, 430, 440 and 450, respectively. Openings S1', S2' and S3' are formed in an opening region between first to third connection pads 460, 470 and 480, and between first to fourth semiconductor chips 420, 430, 440 and 450, respectively. In the opening region, first to third low voltage lines 492A, 494B and 496A and first to third high voltage lines 492B, 494B and 496B are disposed in parallel. For example, openings S1' are formed between the third semiconductor chip 440 and the high voltage lines 496B. Openings S2' are formed between the high voltage lines 496B and the low voltage line 496A. Openings S3' are formed between the low voltage line 496A and the fourth semiconductor chip 450. The first to third low voltage lines 492A, 494A and 496A are connected to a plurality of first to fourth low voltage through chip vias, e.g., 452A. The first to third high voltage lines 492B, 494B and 496B are connected to a plurality of first to fourth high voltage through chip vias, e.g., 454A.

First to fourth doping regions 420C, 430C, 440C and 450C are formed on a bottom surface of the first to fourth semiconductor chips 420, 430, 440 and 450. The first to fourth doping regions 420C, 430C, 440C and 450C are connected to the plurality of first to fourth high voltage through chip vias, e.g., 454A), thereby being biased by a high voltage, e.g., a power supply voltage VDD.

As described above, the semiconductor integrated circuit in accordance with the third exemplary embodiment includes the first to third low voltage lines 492A, 494A and 496A, and the first to third high voltage lines 492B, 494B and 496B. The first to third low voltage lines 492A, 494A and 496A are biased by a low voltage, e.g., a ground voltage VSS. The first to third high voltage lines 492B, 494B and 496B are biased by a high voltage, e.g., a power supply voltage VDD. Thus, parasitic capacitors are formed between the first to third low voltage lines 492A, 494A, and 496A, and the first to third high voltage lines 492B, 494B, and 496B.

Furthermore, the semiconductor integrated circuit in accordance with the third exemplary embodiment includes the first to fourth semiconductor chips 420, 430, 440 and 450, and first to fourth doping regions 420C, 430C, 40C and 450C respectively formed on a bottom surface of the first to fourth semiconductor chips 420, 430, 440 and 450. The first to fourth semiconductor chips 420, 430, 440 and 450 are doped by P-type impurity and are biased by the low voltage VSS. The first to fourth doping regions 420C, 430C, 440C and 450C are biased by the high voltage VDD. Thus, parasitic capacitors are formed between first to fourth semiconductor chips 420, 430, 440, and 450, and the first to fourth doping regions 420C, 430C, 440C, and 450C.

Due to the parasitic capacitors, power interfaced through the first to fourth through chip vias 420A, 430A, 440A, and 450A can be stable. In other words, since the parasitic capacitors serve as reservoir capacitors disposed on an active layer of the first to fourth semiconductor chips 420, 430, 440 and 450, the number of reservoir capacitors disposed on the active layer of the semiconductor chips may be reduced. Accordingly, the semiconductor integrated circuit of the third exemplary embodiment can not only make power stable by virtue of the parasitic capacitors, but can also reduce the size of the semiconductor chips by virtue of the reduced reservoir capacitors. Furthermore, the semiconductor integrated circuit of the third exemplary embodiment can reinforce power mesh and thus is robust against noise, since it includes the first to third low voltage lines 492A, 494A and 496A, the first to third high voltage lines 492B, 494B, and 496B, and the first to fourth doping regions 420C, 430C, 440C, and 450C.

As described above, exemplary embodiments of the present invention can reduce the size of the semiconductor integrated circuit by providing parasitic capacitors for reservoir capacitors and thereby reducing the number of the required reservoir capacitors disposed on an active layer. Also, exemplary embodiments of the present invention can make power stable and increase the operation reliability of semiconductor integrated circuit by virtue of the parasitic capacitors. Furthermore, exemplary embodiments of the present invention can reinforce a power mesh by using a structure for providing parasitic capacitors such as low and high voltage lines and doping regions, thereby being robust against noise and increasing the operation reliability of the semiconductor integrated circuit.

While the present invention has been described with respect to the specific embodiments, it will be apparent to those skilled in the art that various changes and modifications may be made without departing from the spirit and scope of the invention as defined in the following claims.

What is claimed is:

1. An integrated circuit comprising:
 a first semiconductor chip doped with a first conductive type impurity, and configured to receive a first voltage;
 a second semiconductor chip stacked over the first semiconductor chip, doped with the first conductive type impurity, and configured to receive the first voltage;
 a plurality of first and second through chip vias inserted in the first and second semiconductor chips in a vertical direction, and configured to receive the first voltage;
 a first doping region disposed in a bottom of the first semiconductor chip, coupled to the plurality of second through chip vias, and doped with a second conductive type impurity different from the first conductive type impurity;
 a second doping region disposed in a bottom of the second semiconductor chip, coupled to the plurality of second through chip vias inserted in the second semiconductor chip in the vertical direction, and doped with the second conductive type impurity;
 a plurality of first connection pads configured to couple the first semiconductor chip to the second semiconductor chip, by coupling the corresponding first through chip vias;
 a plurality of second connection pads configured to couple the first semiconductor chip to the second semiconductor chip, by coupling the corresponding second through chip vias;
 a first conductive line configured to couple the plurality of first connection pads to each other;
 a second conductive line configured to couple the plurality of second connection pads to each other;
 an isolation layer inserted between the first conductive line and the second conductive line;
 a first isolation film disposed between the first semiconductor chip, excluding the first doping region, and the plurality of second through chip vias inserted in the first semiconductor chip; and
 a second isolation film disposed between the second semiconductor chip, excluding the second doping region, and the plurality of second through chip vias inserted in the second semiconductor chip.

2. The integrated circuit of claim 1, further comprising:
 a third isolation film disposed between the first semiconductor chip including the first doping region and the plurality of first through chip vias inserted in the first semiconductor chip; and
 a fourth isolation film disposed between the second semiconductor chip including the second doping region and the plurality of first through chip vias inserted in the second semiconductor chip.

3. The integrated circuit of claim 1, wherein the first conductive type impurity includes a P-type impurity, and the second conductive type impurity includes an N-type impurity.

4. The integrated circuit of claim 1, wherein the first conductive line and the second conductive line are deposited in parallel.

5. The integrated circuit of claim 1, wherein the first conductive line and the second conductive line are disposed in different layers than each other.

6. The integrated circuit of claim 5, further comprising:
 a fifth isolation film disposed on a portion of the plurality of second connection pads, which is coupled to the first conductive line; and
 a sixth isolation film disposed on a portion of the plurality of first connection pads, which is coupled to the second conductive line.

7. The integrated circuit of claim 5, further comprising polymer layers inserted between the first conductive line and the first semiconductor chip, and between the second conductive line and the second semiconductor chip.

8. The integrated circuit of claim 1, wherein the first conductive line and the second conductive line are disposed in the same layer.

9. The integrated circuit of claim 8, further comprising polymer layers inserted between the first conductive line and the first semiconductor chip, and between the second conductive line and the second semiconductor chip.

10. The integrated circuit of claim 1, wherein the first voltage is a ground voltage and the second voltage is a power supply voltage.

11. The integrated circuit of claim 1, wherein the plurality of first through chip vias and the plurality of second through chip vias are through silicon vias.

* * * * *